(12) United States Patent
Sudo

(10) Patent No.: US 7,848,373 B2
(45) Date of Patent: Dec. 7, 2010

(54) DRIVE CIRCUIT FOR SEMICONDUCTOR LIGHT EMITTING ELEMENT, AND LIGHT SOURCE DEVICE, LIGHTING DEVICE, MONITOR DEVICE, AND IMAGE DISPLAY DEVICE USING THE DRIVE CIRCUIT

(75) Inventor: Kiyoto Sudo, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 73 days.

(21) Appl. No.: 12/367,676

(22) Filed: Feb. 9, 2009

(65) Prior Publication Data
US 2009/0232175 A1 Sep. 17, 2009

(30) Foreign Application Priority Data
Mar. 11, 2008 (JP) .............................. 2008-061377

(51) Int. Cl.
*H01S 3/00* (2006.01)
(52) U.S. Cl. .................................. 372/38.02; 372/29.01
(58) Field of Classification Search ................. 345/204; 362/257; 372/38.03
See application file for complete search history.

(56) References Cited

U.S. PATENT DOCUMENTS

| 4,975,921 | A | * | 12/1990 | Rothe | 372/38.03 |
| 5,287,372 | A | * | 2/1994 | Ortiz | 372/38.07 |
| 7,336,685 | B2 | * | 2/2008 | Tanaka | 372/22 |
| 7,352,784 | B2 | * | 4/2008 | Adams et al. | 372/34 |
| 7,354,157 | B2 | * | 4/2008 | Takeda et al. | 353/30 |
| 7,535,937 | B2 | * | 5/2009 | Luo et al. | 372/21 |
| 2002/0012371 | A1 | * | 1/2002 | Bragin et al. | 372/38.09 |
| 2007/0071047 | A1 | * | 3/2007 | Huang et al. | 372/38.02 |
| 2008/0191677 | A1 | * | 8/2008 | Bacchi et al. | 323/282 |

FOREIGN PATENT DOCUMENTS

JP   A-2004-334083   11/2004

\* cited by examiner

*Primary Examiner*—Minsun Harvey
*Assistant Examiner*—Tuan N. Nguye
(74) *Attorney, Agent, or Firm*—Oliff & Berridge, PLC

(57) ABSTRACT

A drive circuit for a semiconductor light emitting element used for a light source device adapted to output a laser beam converted using a wavelength conversion element adapted to generate a second harmonic wave, includes a switching element connected to a power supply, an inductor having one end connected to the power supply via the switching element, and the other end connected to the ground, a first terminal disposed between the switching element and the inductor, to which a cathode terminal of the semiconductor light emitting element is connected, and a second terminal disposed between the other terminal of the inductor and the ground, to which an anode terminal of the semiconductor light emitting element is connected.

5 Claims, 7 Drawing Sheets

DRIVE CIRCUIT FOR SEMICONDUCTOR LIGHT EMITTING ELEMENT, AND LIGHT SOURCE DEVICE, LIGHTING DEVICE, MONITOR DEVICE, AND IMAGE DISPLAY DEVICE USING THE DRIVE CIRCUIT

BACKGROUND

1. Technical Field

The present invention relates to a drive circuit for driving a semiconductor light emitting element.

2. Related Art

There have been used image display devices irradiating spatial light modulators such as light valves or digital mirror devices (DMD) with illumination beams from light source devices, thereby displaying images. In such image display devices, laser source devices each for emitting a laser beam are sometimes used as the light source devices. Some laser source devices use a second harmonic generation element for converting an incident light into the light with a half wavelength of the incident light, thereby converting infrared light output from a semiconductor laser into the light with a half wavelength of the infrared light through the second harmonic generation element, thus obtaining visible light with high light intensity.

The laser source devices of the related art drive the semiconductor laser using a drive circuit provided, for example, with a DC/DC converter and a switching circuit. Specifically, the switching circuit controls the voltage adjusted by the DC/DC converter to form a voltage with a rectangular waveform to be supplied to the semiconductor laser, and the semiconductor laser emits light in accordance with the current flowing therethrough corresponding to the voltage thus supplied.

JP-A-2004-334083 is an example of a related art document.

The steeper the angle of the waveform representing the light intensity of the incident light is, the higher efficiency the second harmonic generation element can convert the incident light into the second harmonic wave with. However, when driving the semiconductor laser using the voltage with a rectangular waveform, a laser beam with a rectangular waveform having a peak waveform with a gentle slope is output from the semiconductor laser. Therefore, in the drive circuit of the related art, there is a problem that the conversion efficiency of the second harmonic generation element is too low to obtain the laser beam with sufficient light intensity. Further, since the drive circuit of the related art needs the DC/DC converter and the switching circuit, there is also a problem that the configuration of the circuit becomes complicated, and the light emission efficiency is low as the entire laser source device.

The problems described above are not the problems limited to the image display devices, but the problems might arise in monitor devices or lighting devices using the laser source devices.

SUMMARY

In view of the above problems, the present invention has an advantage of improving the emission efficiency of semiconductor light emitting elements and improving the conversion efficiency of second harmonic generation elements.

The invention can be realized as the following embodiments or aspects.

A drive circuit for a semiconductor light emitting element according to a first aspect of the invention is a drive circuit for a semiconductor light emitting element used for a light source device adapted to output a laser beam converted using a wavelength conversion element adapted to generate a second harmonic wave, including a switching element connected to a power supply, an inductor having one end connected to the power supply via the switching element, and the other end connected to the ground, a first terminal disposed between the switching element and the inductor, to which a cathode terminal of the semiconductor light emitting element is connected, and a second terminal disposed between the other terminal of the inductor and the ground, to which an anode terminal of the semiconductor light emitting element is connected.

According to the drive circuit of the first aspect of the invention, when the switching element is set to be in the ON state, the energy is accumulated in the inductor, and when the switching element is set to be in the OFF state, the current with the waveform having a steep rising edge flows through the semiconductor light emitting element in response to the liberation of the energy accumulated in the inductor. As a result, the semiconductor light emitting element emits light. Therefore, the laser beam with the peak waveform having a steep rising edge in accordance with the current waveform flowing through the semiconductor light emitting element can be output from the semiconductor light emitting element towards the wavelength conversion element, thus the conversion efficiency of the laser beam in the wavelength conversion element can be improved.

The drive circuit of a semiconductor light emitting element according to the first aspect of the invention further supplying the switching element with a rectangular signal having a predetermined duty ratio for driving the switching element. According to the drive circuit of the first aspect of the invention, the height of the waveform representing the current flowing through the semiconductor light emitting element, namely the current value can be controlled by controlling the duty ratio of the rectangular wave. Therefore, the height of the peak waveform of the laser beam output from the semiconductor light emitting element can be set to be a desired height. Therefore, the light intensity of the laser beam in the wavelength conversion element can be controlled as desired.

A light source device according to a second aspect of the invention includes the drive circuit of a semiconductor light emitting element according to the first aspect of the invention, a power supply, and a wavelength conversion element adapted to convert the laser beam, which is output from the semiconductor light emitting element, into a second harmonic wave. According to the light source device of the second aspect of the invention, the laser beam output from the semiconductor light emitting element can be made to have the peak waveform with a steep rising edge. Therefore, since the laser beam represented by the waveform having a steep rising edge can be input to the wavelength conversion element, the conversion efficiency of the wavelength conversion element can be improved. Further, since the drive circuit with good emission efficiency of the laser beam is used to drive the semiconductor light emitting element, the emission efficiency of the light source device can be enhanced, and at the same time the power consumption can be suppressed.

A lighting device according to a third aspect of the invention includes the light source device according to the second aspect of the invention. According to the lighting device of the third aspect of the invention, since the light source device with good emission efficiency is provided, the power consumption can be suppressed.

A monitor device according to a fourth aspect of the invention includes the light source device according to the second aspect of the invention, and an imaging section adapted to image an object irradiated with the light source device. According to the monitor device of the fourth aspect of the invention, since the light source device with good emission efficiency according to the second aspect of the invention is provided, the power consumption can be suppressed.

An image display device according to a fifth aspect of the invention includes the light source device according to the second aspect of the invention, and a light modulation device adapted to modulate the light, which is emitted from the light source device, in accordance with image information. According to the image display device of the fifth aspect of the invention, since the light source device with good emission efficiency is provided, the power consumption can be suppressed.

The various aspects of the present invention described above can be applied while being combined or partially eliminated according to needs.

BRIEF DESCRIPTION OF THE DRAWINGS

The invention will now be described with reference to the accompanying drawings, wherein like numbers reference like elements.

DESCRIPTION OF EXEMPLARY EMBODIMENTS

Some embodiments of the invention including application examples will hereinafter be explained with reference to the accompanying drawings.

A. First Embodiment

A1. Configuration of Light Source Device

Figure 1:
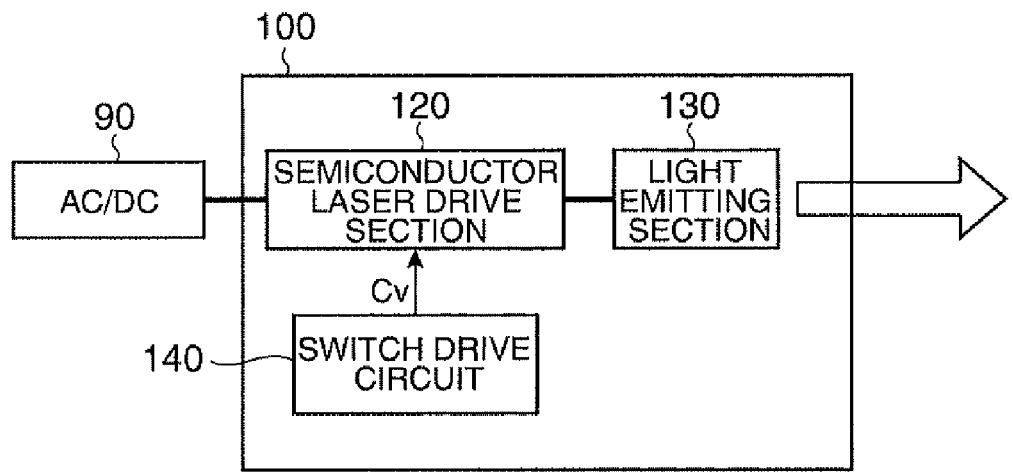
FIG. 1 is an explanatory diagram for exemplifying a schematic configuration of a light source device 100 according to an embodiment.

FIG. 1 is an explanatory diagram for exemplifying a schematic configuration of a light source device 100 according to the embodiment. It should be noted that FIG. 1 also shows an AC/DC converter 90 for supplying power to the light source device 100. As shown in FIG. 1, the light source device 100 is provided with a semiconductor laser drive section 120, a light emitting section 130, a switch drive circuit 140 for driving a switching element included in the semiconductor laser drive section 120.

Figure 2:
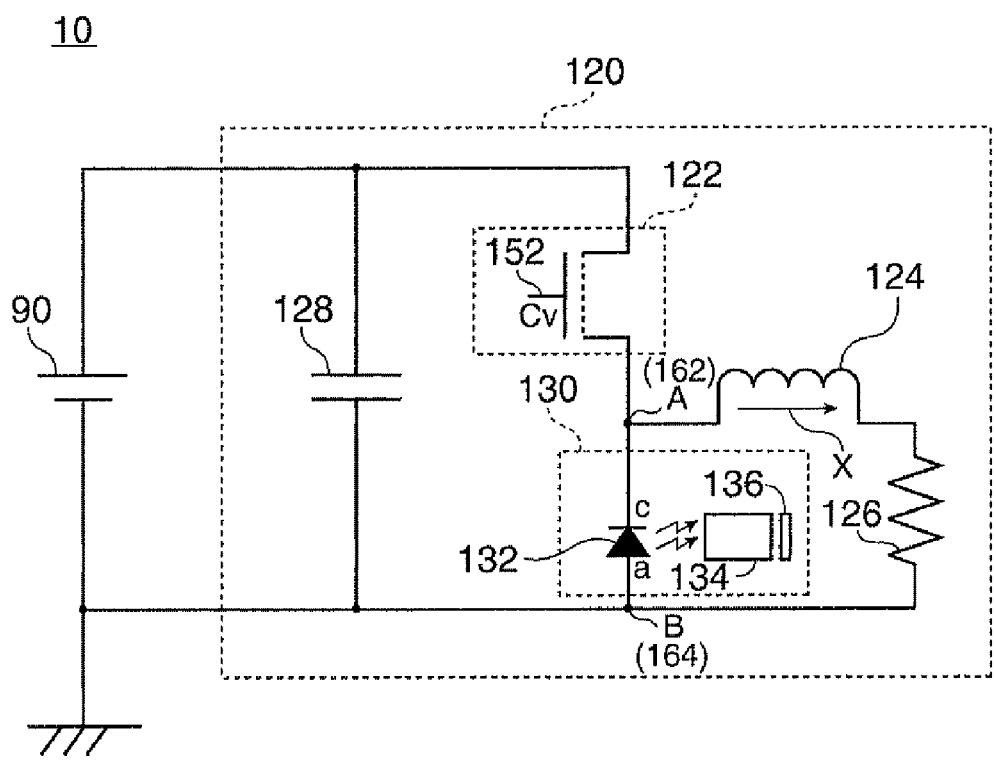
FIG. 2 is an explanatory diagram for exemplifying the internal configuration of a semiconductor laser drive section 120 and a light emitting section 130 according to the embodiment.

FIG. 2 is an explanatory diagram for exemplifying the internal configuration of the semiconductor laser drive section 120 and the light emitting section 130 according to the embodiment. A drive circuit provided to the light emitting section 130 and for driving the semiconductor laser will hereinafter be explained with reference to FIGS. 1 and 2. The semiconductor laser functions as a light source of the light source device 100.

The AC/DC converter 90 converts an alternating current with a predetermined voltage into a direct current with different voltage.

The semiconductor laser drive section 120 accumulates energy in accordance with the alternating-current component of the current supplied from the AC/DC converter 90, and supplies the light emitting section 130 with the current using the energy thus accumulated. Specifically, as shown in FIG. 2, the semiconductor laser drive section 120 is provided with a switching circuit 122, an inductor 124, a resister 126, and a capacitor 128. The switching circuit 122, the inductor 124, and the resister 126 are serially connected in this order. Further, the capacitor 128 is connected to the inductor 124 and the resistor 126 in parallel. The switching circuit 122 is provided with a transistor 152 for controlling supplying and stopping supplying the voltage from the AC/DC converter 90 to the inductor 124 and the resistor 126. Further, the semiconductor laser drive section 120 is provided with a first terminal 162, which is disposed between the transistor 152 and the inductor 124 and to which a cathode terminal of the semiconductor laser 132 is connected, and a second terminal 164 used for connecting the anode terminal of the semiconductor laser 132 to the ground.

The switch drive circuit 140 supplies the semiconductor laser drive circuit 120 with a voltage control signal Cv with a rectangular waveform having a predetermined duty ratio.

A gate terminal of the transistor 152 is provided with the voltage control signal Cv. The transistor 152 is set to be an ON state or an OFF state in accordance with the voltage control signal Cv.

As shown in FIG. 2, the light emitting element 130 is provided with the semiconductor laser 132, a wavelength conversion element 134, and an external resonator 136, and emits visible light. The semiconductor laser 132 has the anode terminal a connected to an intermediate point between the switching circuit 122 and the inductor 124, and the cathode terminal c connected to the ground. The semiconductor laser 132 emits infrared light with a wavelength shorter than visible light. Hereinafter, it is assumed that the position of the first terminal 162 to which the cathode terminal c is connected is a point A, and the position of the second terminal 164 to which the anode terminal a is connected is a point B. The wavelength conversion element 134 generates the second harmonic wave using the second harmonic generation (SHG) phenomenon. It should be noted that the external resonator 136 can be eliminated, and it is possible to adopt a configuration that the wavelength conversion element 134 executes wavelength conversion on the laser beam directly oscillated by the semiconductor laser 132 to emit the visible light.

The output of the laser beam of the light source device 100 will be explained. When the transistor 152 is set to be in the ON state, a current flows through the inductor 124 in a direction indicated by the arrow X in FIG. 2. Magnetic energy is accumulated in the inductor 124 in accordance with the alternating component of the current flowing through the inductor 124. It should be noted that since the cathode terminal c and the anode terminal a of the semiconductor laser 132 are respectively connected to the points A and B, the direction from the point B towards the point A becomes the forward direction, and the current does not flow from the point A to the point B through the semiconductor laser 132.

On the other hand, when the transistor 152 is set to be in the OFF state, the connection between the inductor 124 and the power supply is cut, and a closed circuit composed of the inductor 124, the resistor 126, and the semiconductor laser 132 connected in series is formed. As a result, induced electromotive force induced in the direction of hampering the variation in the magnetic field, namely the magnetic flux, is generated in the inductor 124. The induced electromotive force makes the current flow through the resister 126 and the semiconductor laser 132 in this order. The current flowing in accordance with the induced electromotive force of the inductor 124 is also called a flyback current.

The semiconductor laser 132 emits the infrared laser beam with the light intensity corresponding to the amount of current flowing through the semiconductor laser 132 towards the wavelength conversion element 134. The wavelength conversion element 134 converts the infrared laser beam input thereto into the second harmonic wave to emit the laser beam of the visible light. In a manner described above, the laser beam of the visible light is output from the light source device 100.

The wavelength conversion element 134 converts the infrared laser beam input therein into the second harmonic wave with the higher conversion efficiency, the steeper the rising of the peak waveform of the infrared laser beam input therein is. Therefore, in order for improving the conversion efficiency of the wavelength conversion element 134 in converting the laser beam into the second harmonic wave, it is sufficient to make the waveform of the laser beam input to the wavelength conversion element 134 have the peak waveform with a steep rising edge.

Figure 3:
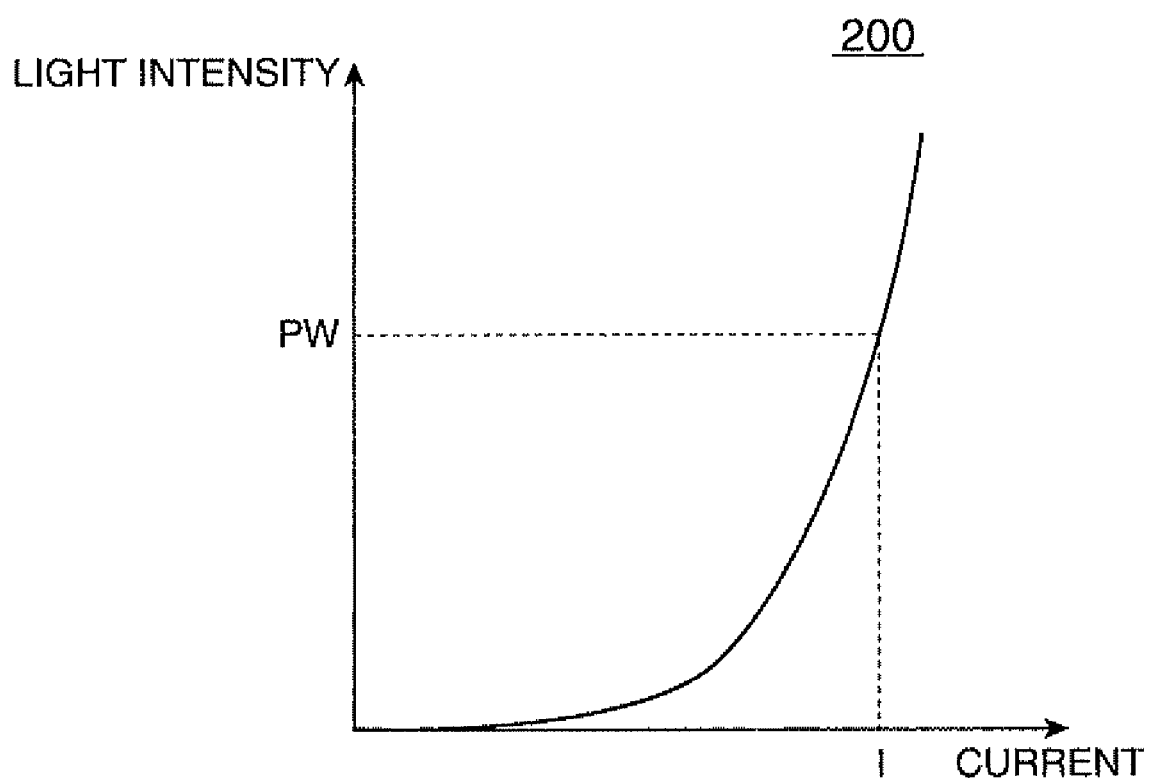
FIG. 3 is a graph showing an amount of current flowing through the semiconductor laser 132 according to the embodiment and light intensity of a laser beam emitted from the semiconductor laser 132.

FIG. 3 is a graph showing an amount of current flowing through the semiconductor laser 132 according to the embodiment and light intensity of the laser beam emitted from the semiconductor laser 132. In FIG. 3, the lateral axis represents the value of the current flowing through the semiconductor laser 132, and the vertical axis represents the light intensity of the laser beam output from the semiconductor laser 132. As shown in the graph 200 of FIG. 3, the light intensity of the laser beam output from the semiconductor laser 132 increases in accordance with increase in the current value. Therefore, by supplying the semiconductor laser 132 with a high density current, it is possible to output the laser beam represented with the peak waveform having a steep rising edge through the semiconductor 132.

A2. Peak Waveform of Laser Beam

Figure 4:
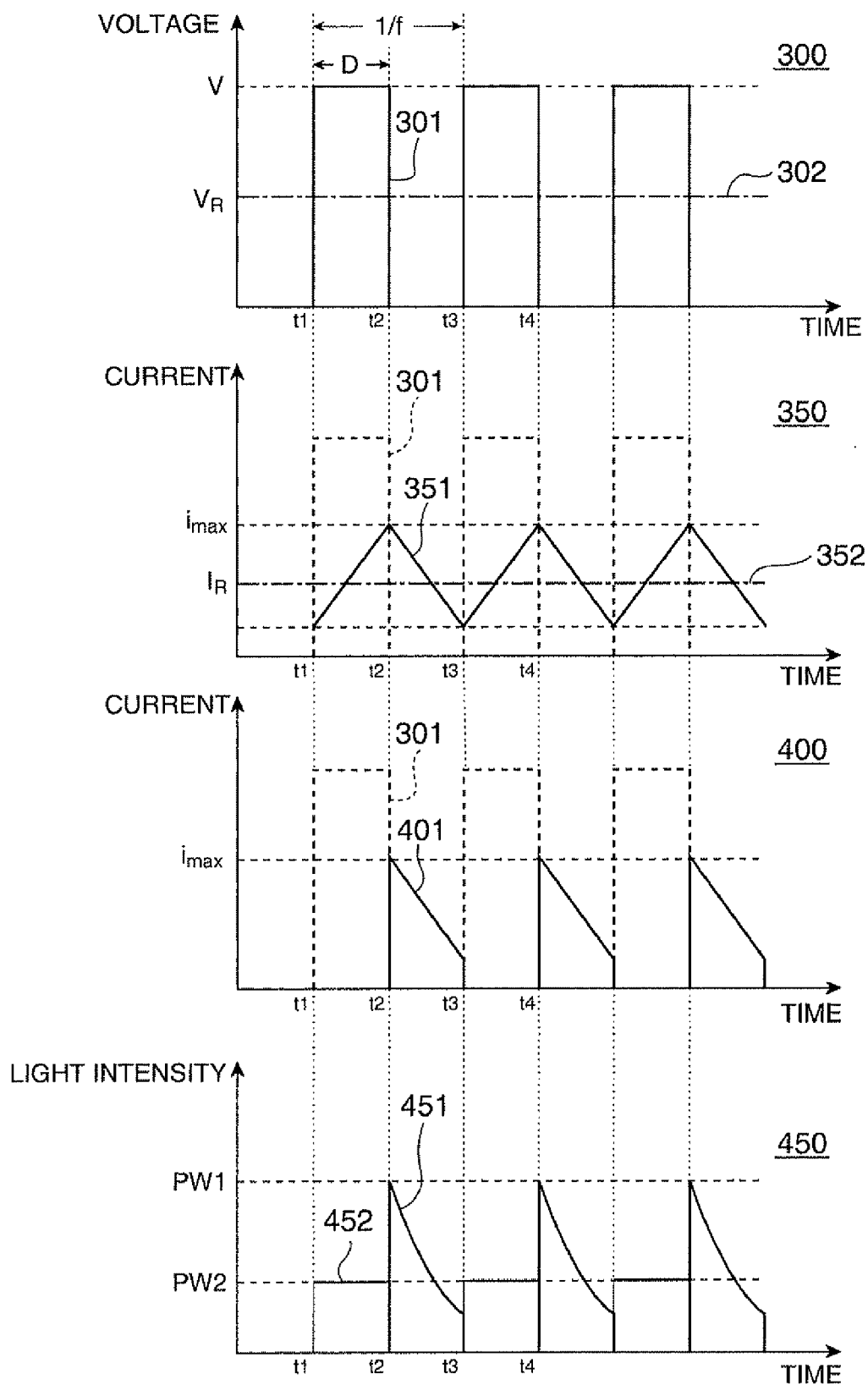
FIG. 4 is a waveform chart for explaining waveforms of a current, a voltage, and light intensity according to the embodiment.

FIG. 4 is a waveform chart for explaining waveforms of the current, the voltage, and the light intensity according to the embodiment. In FIG. 4, the waveform chart 300 is a waveform chart showing the waveform of the voltage applied to the point A of the embodiment, the waveform chart 350 is a waveform chart showing the waveform of the current flowing through the point A of the embodiment. Further, the waveform chart 400 is a waveform chart showing the waveform of the current flowing through the semiconductor laser 132, and the waveform 450 is a waveform showing the peak waveform of the infrared laser beam output from the semiconductor laser 132. In the waveform charts 300, 350, 400, and 450, the lateral axis represents the time elapsed. In the embodiment, the transistor 152 is set to be in the ON state at the time points t1, t3, and the transistor 152 is set to be in the OFF state at the time points t2, t4. Further, the vertical axis of the waveform chart 300 represents the voltage, the vertical axes of the waveform charts 350 and 400 represent the current, and the vertical axis of the waveform chart 450 represents the light intensity.

The rectangular wave 301 of the waveform chart 300 shows the waveform of the voltage applied to the point A, and the waveform chart 350 shows the waveform 351 showing the current flowing through the point A in a direction towards the inductor 124. Further, the waveform 401 of the waveform chart 400 shows the value of the current flowing through the semiconductor laser 132, and the peak waveform 451 of the waveform chart 450 shows the waveform of the laser beam emitted from the semiconductor laser 132 in the embodiment.

FIG. 300 shows additionally the voltage between the both ends of the resistor 126. It should be noted that in the embodiment, the direct-current voltage is applied to the resistor 126, and the direct current flows through the resistor 126. The voltage value $V_R$ of the both ends of the resistor 126 shown in the waveform chart 300 represents an average value. The average value $V_R$ of the voltage value applied to the both ends of the resistor 126 is expressed by the formula 1 below. It should be noted that in the embodiment, V represents the voltage of the AC/DC converter 90, $V_R$ represents the voltage between the both ends of the resistor 126, and D represents the duty ratio of the voltage of the rectangular wave 301 applied to the inductor 124.

$$V_R = V \times D \qquad \text{(Formula 1)}$$

When the transistor 152 is set to be in the ON state at the time point t1, as shown in the waveform chart 300, the voltage V represented by the rectangular wave 301 is applied to the point A. During the period in which the transistor 152 is kept in the ON state, the current flows through the inductor 124, and the magnetic field is generated around the inductor 124. More specifically, during the period in which the transistor 152 is kept in the ON state, the alternating component overlapping the direct current flows through the inductor 124, and the direct current flows through the resistor 126. The current value i of the alternating current flowing through the inductor 124 is expressed by the formula 2 below using the formula 1, and the current value I of the direct current flowing through the resistor 126 is expressed by the formula 3 below using the formula 1. It should be noted that in the embodiment, t represents the period in which the transistor 152 is kept in the ON state, L represents the inductance of the inductor 124, and R represents the resistance of the resistor 126.

$$i = (V - V_R) \times t \div L = V(1-D) \times t \div L \qquad \text{(Formula 2)}$$

$$I = \frac{V \times D}{R} \qquad \text{(Formula 3)}$$

As shown in the formula 4 below, a current $i_{ac}$ of the total value of the current values expressed respectively by the formula 2 and the formula 3 flows through the inductor 124.

$$i_{ac} = \frac{V(1-D) \times t}{2 \times L} + \frac{V \times D}{R} \qquad \text{(Formula 4)}$$

The period $t_{max}$ in which the transistor 152 is kept in the ON state is expressed by the formula 5 below using the frequency f and the duty ratio D of the rectangular wave voltage.

$$t_{max} = \frac{D}{f} \Lambda \qquad \text{(Formula 5)}$$

Therefore, the maximum value $i_{max}$ of the current flowing through the inductor 124 is represented by the formula 6 below using the formula 4 and the formula 5.

$$i_{max} = VD\left(\frac{1-D}{2fL} + \frac{1}{R}\right)\Lambda \qquad \text{(Formula 6)}$$

When the transistor 152 is set to be in the ON state at the time point t1, as shown in the waveform 351 of the waveform chart 350, the value of the current flowing through the inductor 124 gradually rises, and reaches the maximum value $i_{max}$ expressed by the formula 6 at the time point t2. During the period (between the time points t1 and t2) in which the transistor 152 is kept in the ON state, the magnetic energy P expressed by the formula 7 below caused by the current flowing therethrough is accumulated in the inductor 124.

$$P = \frac{Li^2}{2} \Lambda \qquad \text{(Formula 7)}$$

In the embodiment, the current is applied to the semiconductor laser 132 using the magnetic energy accumulated in the inductor 124 in a manner as described above. When the transistor 152 is set to be in the OFF state at the time point t2, the voltage at the point A becomes zero. When the transistor 152 is set to be in the OFF state, the induced electromotive force is generated in the inductor 124, and it becomes possible to make the current flow from the inductor 124 to the resistor 126 and the semiconductor laser 132 using the induced electromotive force. Since the inductor 124 has a characteristic of acting so as to hamper the variation in the current flowing through the inductor 124, the inductor 124 acts so as to flow a current with the same current value as the current value $i_{max}$ of the current, which has flown through the inductor immediately before the transistor 152 is set to be in the OFF state, in the same direction as that of the current, which has flown through the inductor 112 immediately before the transistor 152 is set to be in the OFF state. Therefore, as shown in the waveform 401 of the waveform chart 400, at the time point t2 immediately after the transistor 152 is set to be in the OFF state, the current with the maximum value $i_{max}$ of the current, which has flown through the inductor 124, flows through the semiconductor laser 132, and the current flowing through the semiconductor laser 132 reduces as the magnetic energy accumulated in the inductor 124 is liberated as shown in the period between the time points t2 and t3. Specifically, a current having the peak waveform with a steep rising edge as shown in the waveform 401 is supplied to the semiconductor laser 132. It should be noted that by liberating the energy accumulated in the inductor 124 in a short period of timer it is possible to apply a high density current to the semiconductor laser 132. The higher the duty ratio D is, the higher density current can be applied to the semiconductor laser 132.

The semiconductor laser 132 emits light in response to the current supply. As shown in the waveform chart 450, the light intensity of the laser beam output from the semiconductor laser 132 increases in accordance with increase in the value of the current flowing through the semiconductor laser 132. Therefore, when the current with the waveform having a steep rising edge as shown in the waveform chart 400 is applied to the semiconductor laser 132, the semiconductor laser 132 outputs the laser beam represented by the peak waveform 451 with a steep rising edge as shown in the waveform chart 450.

A waveform 452 in the waveform chart 450 shows the waveform of the laser beam output from the semiconductor laser with the semiconductor laser drive circuit of the related art described later. Since the semiconductor laser drive circuit of the related art supplies the semiconductor laser with a rectangular wave current, the waveform of the laser beam output from the semiconductor laser also has a rectangular shape as shown in the waveform 452.

A3. Relationship between Duty Ratio and Magnetic Energy

The waveform chart 450 shows the case in which the duty ratio D=0.5 is satisfied, and if the duty ratio is made greater than 0.5, the value of the current flowing through the inductor 124 increases, and the magnetic energy to be accumulated also increases. The variation in the magnetic energy due to the variation in the duty ratio will be explained with reference to FIG. 5.

Figure 5:
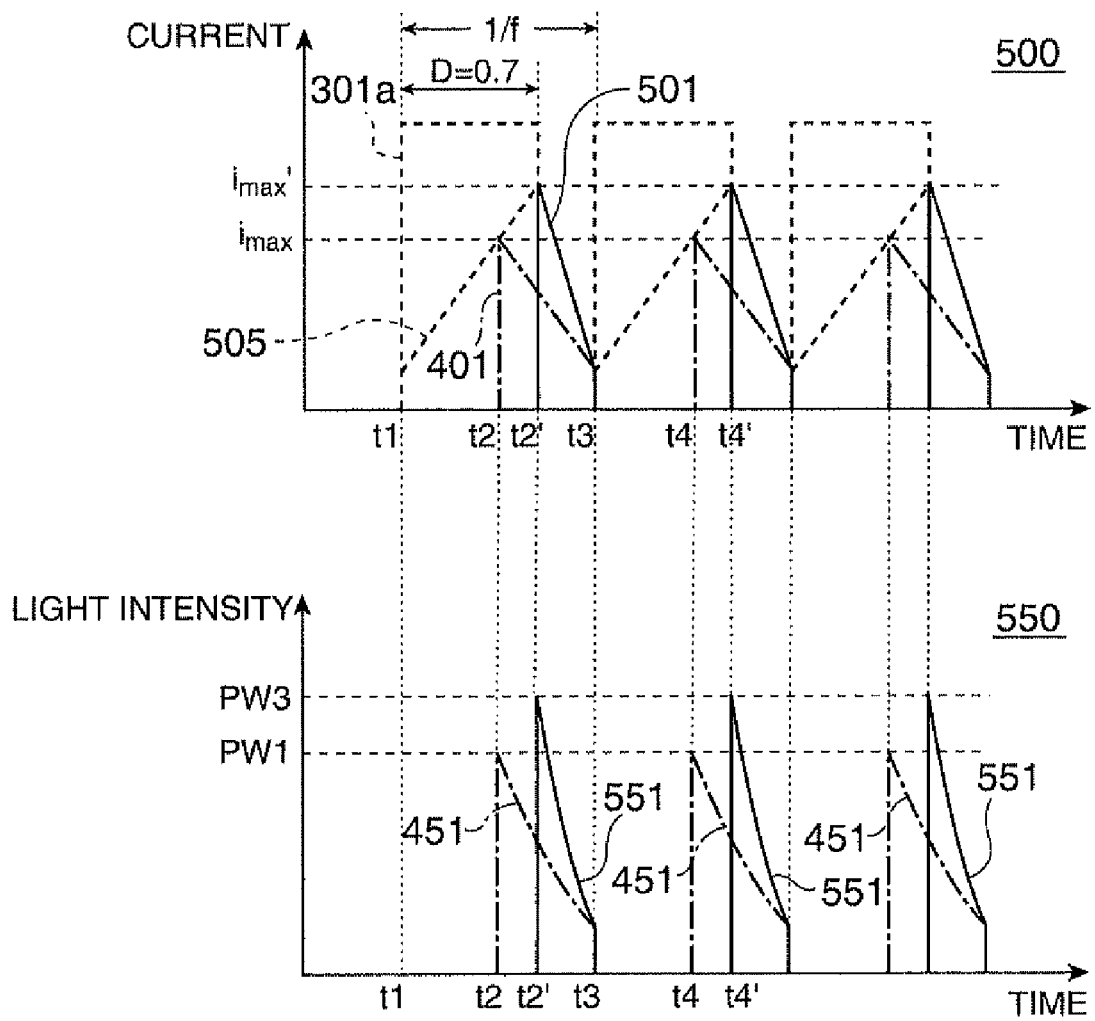
FIG. 5 is an explanatory diagram for exemplifying a variation in a peak waveform when varying a duty ratio D according to the embodiment.

FIG. 5 is an explanatory diagram for exemplifying a variation in a peak waveform when varying the duty ratio D according to the embodiment. In the waveform chart 500 of FIG. 5, the lateral axis represents time t similarly to the waveform charts 300, 350, 400, and 450, and the vertical axis represents a current value. The waveform 401 represents the waveform of the current flowing through the semiconductor laser 132 with the duty ratio D=0.5, and the waveform 501 shows the current flowing through the semiconductor laser 132 with the duty ratio D=0.7. The waveform 505 illustrated with a broken line represents the current flowing through the inductor 124. Further, in the waveform chart 550, the lateral axis represents time t similarly to the waveform charts 300, 350, 400, and 450, and the vertical axis represents the light intensity of the laser beam emitted from the semiconductor laser 132. The waveform 551 represents the peak waveform of the laser beam output from the semiconductor laser 132 with the duty ratio D=0.7, and the waveform 451 shows the peak waveform of the laser beam output from the semiconductor laser 132 with the duty ratio D=0.5.

As shown in waveform chart 500, in the case of the duty ratio D=0.7, the current flows through the inductor 124 until the time point t2' later than the time point t2. As a result, a greater amount of magnetic energy is accumulated in the inductor 124 compared to the case with the duty ratio D=0.5. When the transistor 152 is set to be in the OFF state, a current flows through the semiconductor laser 132. The waveform 501 of the current flowing through the semiconductor laser 132 becomes to have a greater height (representing a larger amount of current) compared to the waveform 401 of the current flowing through the semiconductor laser 132 with the duty ratio D=0.5. As a result, the peak waveform 551 of the laser beam output from the semiconductor laser 132 with the duty ratio D=0.7 becomes to have a greater height compared to the peak waveform 451 of the laser beam output from the semiconductor laser 132 with the duty ratio D=0.5. Therefore, the light intensity PW3 of the laser beam output from the semiconductor laser 132 with the duty ratio D=0.7 becomes greater than the intensity PW1 of the laser beam output from the semiconductor laser 132 with the duty ratio D=0.5.

As described above, by varying the duty ratio D, the height of the peak waveform of the laser beam, namely the light intensity of the laser beam output from the semiconductor laser 132 can be controlled.

A4. Comparison with Example of the Related Art

The difference between the drive circuit of the semiconductor laser 132 of the embodiment and the drive circuit of the semiconductor laser of the related art will be explained with arbitrary reference to FIGS. 2, 4, and 6.

Figure 6:
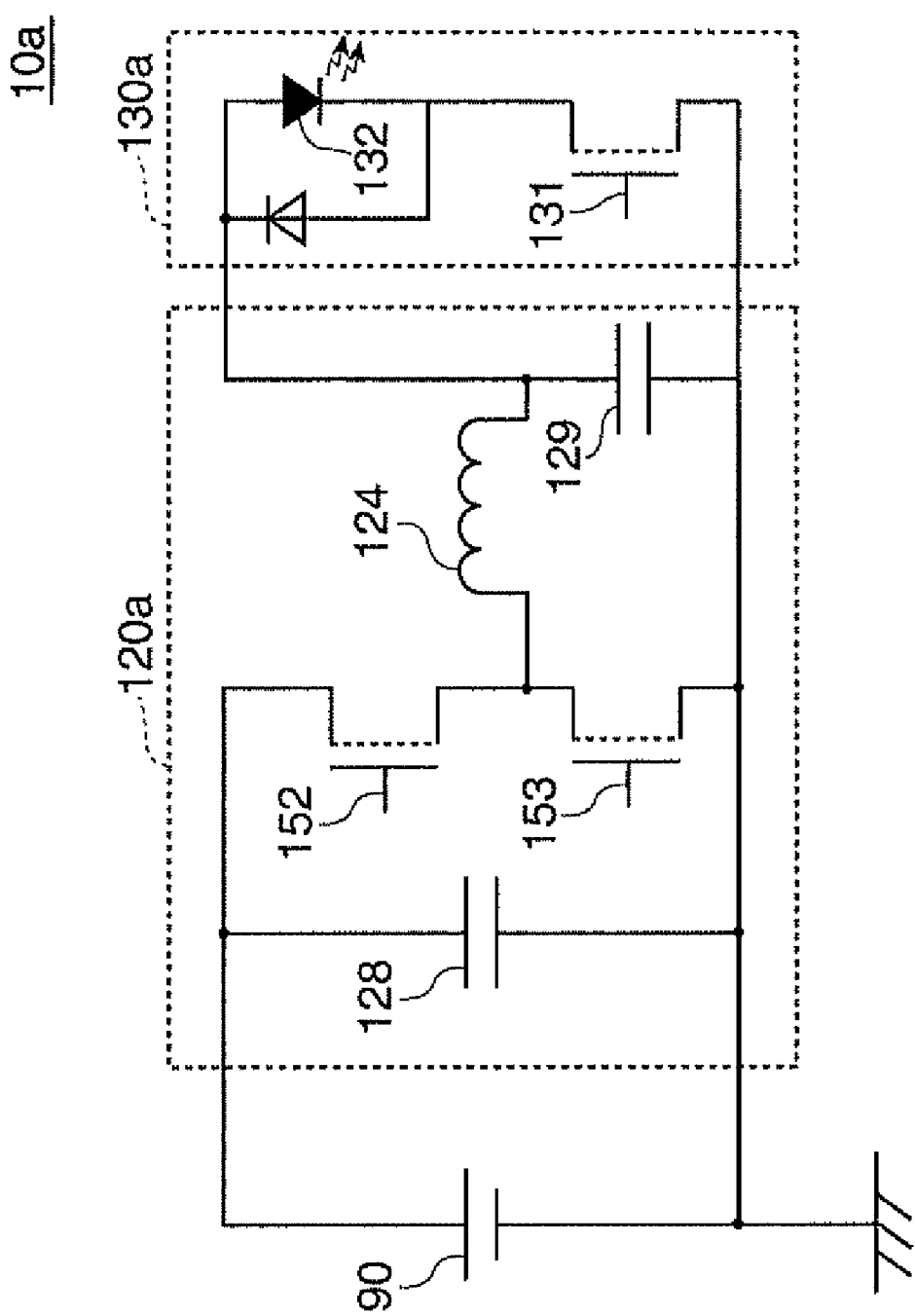
FIG. 6 is an explanatory diagram for exemplifying a drive circuit of the semiconductor laser 132 in the related art example.

FIG. 6 is an explanatory diagram for exemplifying the drive circuit 10a of the semiconductor laser 132 in the related art example. As shown in FIG. 6, the drive circuit 10a of the related art example is provided with a semiconductor laser drive section 120a and a light emitting section 130a. The semiconductor laser drive section 120a is formed as a DC/DC converter provided with two transistors 152, 153, an inductor 124, and capacitors 128, 129. Hereinafter, the semiconductor laser drive section 120a is referred to as the DC/DC converter 120a. The semiconductor laser drive section 120a converts a first direct-current voltage supplied from the AC/DC converter 90 into a second direct-current voltage, and outputs the second direct-current voltage. The light emitting section 130a is formed as a switching circuit provided with a transistor 131 and the semiconductor laser 132. Hereinafter, the light emitting section 130a is referred to as the switching circuit 130a. When the transistor 131 is set to be in the ON state, the DC/DC converter 120a and the semiconductor laser 132 are connected to each other, and the direct current flows through the semiconductor laser 132 in accordance with the voltage supplied from the DC/DC converter 120a. When the transistor 131 is set to be in the OFF state, the connection between the DC/DC converter 120a and the semiconductor laser 132 is cut, and the current stops flowing through the semiconductor laser 132. The semiconductor laser 132 outputs the laser beam with the light intensity corresponding to the amount of the current flowing through the semiconductor laser 132. In the drive circuit 10a of the related art, since a constant current flows through the semiconductor laser 132 during the period in which the transistor 131 is set to be in the ON state, the peak waveform of the laser beam output from the semiconductor laser 132 becomes to have a roughly rectangular shape with a low height as shown in the waveform 452 of the waveform chart 450 shown in FIG. 4. Therefore, in the drive circuit 10a of the semiconductor laser of the related art show in FIG. 6, the conversion efficiency of the laser beam by the wavelength conversion element not shown is low.

Since the drive circuit 10 of the embodiment drives the semiconductor laser 132 using the current caused by the induced electromotive force of the inductor 124 as shown in FIG. 2, the capacitor 129 used for smoothing in the drive circuit 10a of the related art can be eliminated. Therefore, in the drive circuit 10 of the embodiment, it is sufficient to provide the resistor 126 for defining the current flowing from the inductor to the semiconductor laser 132 instead of the capacitor of the drive circuit 10a of the related art, eliminate the switching circuit 130a of the drive circuit 10a of the related art, and replace the transistor 153 with the semiconductor laser 132.

Since the drive circuit 10 of the embodiment does not need the switching circuit 130a for controlling the power supply to the semiconductor laser 132, the entire drive circuit can be simplified, and the loss of the supply power to the semiconductor laser 132 caused by a process of switching between the ON state and the OFF state of the switching circuit 130a can be reduced.

According to the light source device 100 of the embodiment, the semiconductor laser 132 can output the laser beam with the peak waveform having a steep rising edge to the wavelength conversion element 134. Since the steeper the rising edge of the peak waveform of the incident laser beam is, the higher the conversion efficiency of the wavelength conversion element 134 is obtained in converting the incident laser beam into the second harmonic wave, according to the light source device 100 of the embodiment, the conversion efficiency of the laser beam in the wavelength conversion element 134 can be improved.

Further, according to the light source device of the embodiment, the circuit configuration can be simplified compared to the drive circuit of the related art. Therefore, the power loss in the drive circuit of the related art can be suppressed. As a result, in the light source device, the emission efficiency representing the output light intensity of the semiconductor laser 132 with respect to the power supplied from the power supply can be improved. Therefore, the power consumption of the light source device 100 can be reduced.

B. Application Examples of Light Source Device

B1. Lighting Device

Figure 7:
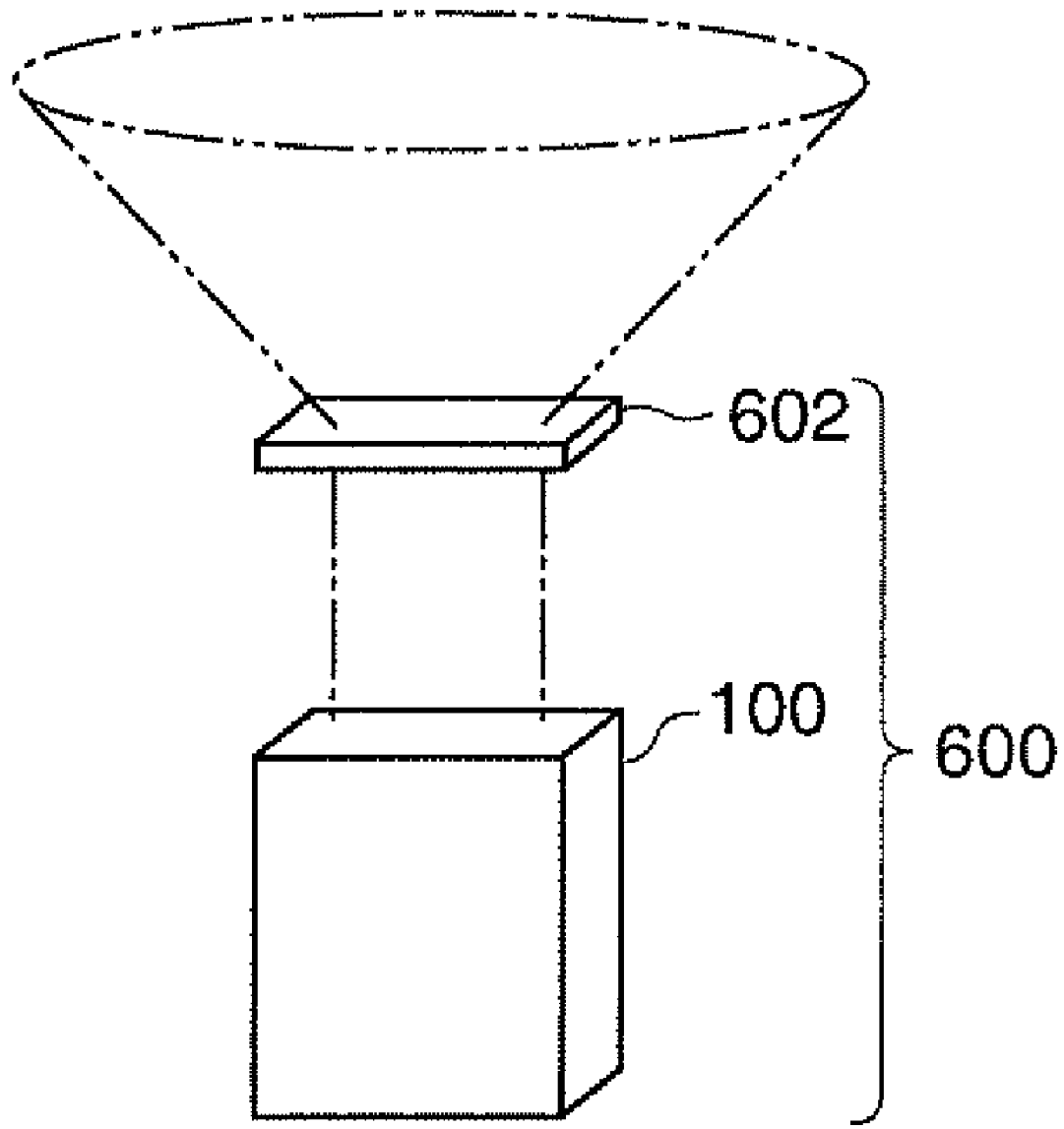
FIG. 7 is an explanatory diagram showing a lighting device 600 as a first application example of the light source device 100.

FIG. 7 is an explanatory diagram showing a lighting device 600 as a first application example of the light source device 100. As shown in the drawing, the lighting device 600 is provided with the light source device 100 described above and a diffusing plate 602 for diffusing the laser beam emitted from the light source device 100.

Since the lighting device 600 is equipped with the light source device 100 described above, it becomes possible to enhance the efficiency of the lighting device 600, thus reducing the power consumption.

B2. Monitor Device

Figure 8:
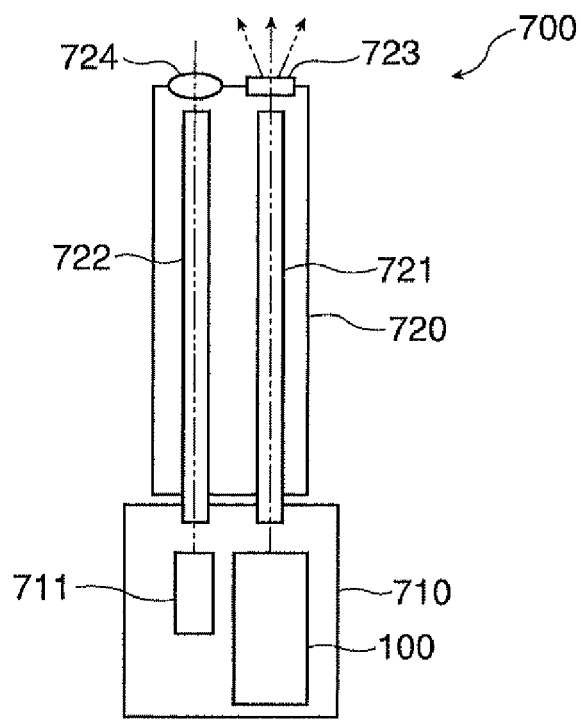
FIG. 8 is an explanatory diagram showing a monitor device 700 as a second application example of the light source device 100.

FIG. 8 is an explanatory diagram showing a monitor device 700 as a second application example of the light source device 100. As shown in the drawing, the monitor device 700 is provided with a device main body 710 and an optical transmission section 720. The device main body 710 is provided with the light source device 100 described above and a camera 711.

The light transmission section 720 is provided with two light guides 721, 722, a diffusing plate 723, and a lens 724. Each of the light guides 721, 722 is formed of a bundle of a number of optical fibers. The laser beam emitted from the light source device 100 is guided by the first light guide 721 to enter the diffusing plate 723. The light diffused by the diffusing plate 723 illuminates the object. The light reflected by the object enters the second light guide 722 via the lens 724. The light, which enters the second light guide 722, is guided to the camera 711. Thus, the object is imaged by the camera 711.

Since the monitor device 700 is equipped with the light source device 100 described above, it becomes possible to enhance the efficiency of the monitor device 700, thus reducing the power consumption. It should be noted that the camera 711 shown in FIG. 8 corresponds to an imaging section in the invention.

B3. Projector

Figure 9:
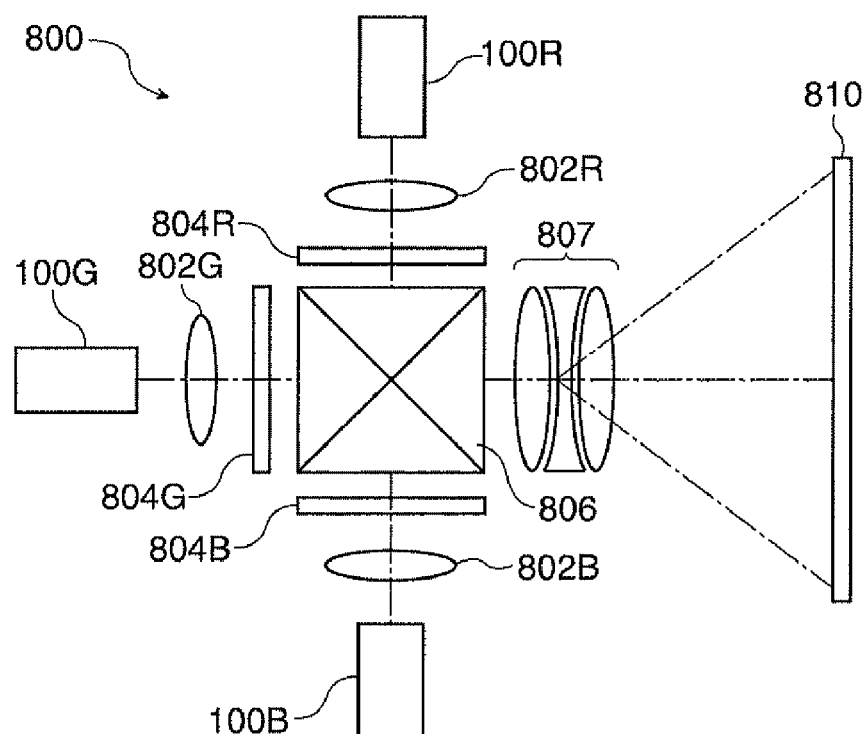
FIG. 9 is an explanatory diagram showing a schematic configuration of a projector 800 as a third application example of the light source device 100.

FIG. 9 is an explanatory diagram showing a schematic configuration of a projector 800 as a third application example of the light source device 100. As shown in the drawing, the projector 800 is provided with three light source devices 100R, 100G, and 100B, three equalizing optical systems 802R, 802G, and 802B, three liquid crystal light valves 804R, 804G, and 804B, a cross dichroic prism 806, and a projection lens 807.

The three light source devices 100R, 100G, and 100B each have substantially the same configuration as that of the light source device 100 described above. It should be noted that the first light source device 100R emits a red laser beam. The second light source device 100G emits a green laser beam. The third light source device 100B emits a blue laser beam. Further, the wavelength of the laser beam is changed by changing the semiconductor laser 132, the wavelength conversion element 134, or both of the semiconductor laser 132 and the wavelength conversion element 134 in the light source device 100.

The equalizing optical systems 802R, 802G, and 802B equalize the illumination distributions of the light beams emitted from the corresponding light source devices 100R, 100G, and 100B, respectively. For example, the equalizing optical systems 802R, 802G, and 802B are each formed of a hologram or a field lens. The liquid crystal light valves 804R, 804G, 804B respectively modulate the light beams emitted from the corresponding equalizing optical systems 802R, 802G, 802B in accordance with image information. The cross dichroic prism (a color combining section) 806 combines the three modulated light beams emitted from the three liquid crystal light valves 804R, 804G, and 804B. The projection lens 807 projects the light combined by the cross dichroic prism 806 on a screen 810. As a result, a color image is displayed on the screen 810.

Since the projector 800 is equipped with the light source devices 100R, 100G, and 100B substantially the same as the light source device 100 described above, it becomes possible to enhance the efficiency of the projector 800, thus reducing the power consumption. It should be noted that the projector shown in FIG. 9 corresponds to an image display device of the appended claims, and the liquid crystal valve corresponds to a light modulation device.

Although in FIG. 9, the projector 800 is provided with the liquid crystal light valves as the light modulation devices, it is possible that the projector 800 is provided with micromirror type light modulation devices such as digital micromirror devices (DMD, a trademark of Texas Instruments) instead thereof. Further, although the projector 800 is shown as the third application example of the light source device 100 in FIG. 9, the light source device can generally be applied to the image display devices.

C. Modified Examples

1. Although in the embodiment described above, the inductor is used as an element for accumulating the energy, any element, besides the inductor, accumulating the energy in accordance with current supply, and liberating the energy thus accumulated in response to stop of the current supply, thereby flowing the flyback current can also be adopted.

2. Although in the embodiment, the resistor 126 is used for defining the value of the current flowing through the semiconductor laser 132, the resistor 126, for example, can be eliminated. Thus, the drive circuit 10 can more simply be configured, and the cost reduction can be achieved.

3. Although in the embodiment, the AC/DC converter 90, the switching circuit 122, the inductor 124, and the resistor 126 are serially connected in this order, the same advantage can be obtained even in the case in which the inductor 124 and the resistor 126 are disposed in a different order.

4. In the embodiment described above, it is possible to replace a part of the configuration realized by hardware with software, or to replace a part of the configuration realized by software with hardware.

Hereinabove, the embodiment and various application examples of the invention are described. The invention is not limited to these embodiment and application examples, but can take various configurations within the scope of the invention.

The entire disclosure of Japanese Patent Application No. 2008-61377, filed Mar. 11, 2008 is expressly incorporated by reference herein.

What is claimed is:

1. A drive circuit for a semiconductor light emitting element used for a light source device adapted to output a laser beam converted using a wavelength conversion element adapted to generate a second harmonic wave, comprising:
   a switching element connected to a power supply;
   an inductor having one end connected to the power supply via the switching element, and the other end connected to the ground;
   a first terminal disposed between the switching element and the inductor, to which a cathode terminal of the semiconductor light emitting element is connected; and
   a second terminal disposed between the other terminal of the inductor and the ground, to which an anode terminal of the semiconductor light emitting element is connected, only the switching element, the inductor and the cathode terminal of the semiconductor light emitting element being connected to the first terminal;
   wherein a resistor element connected to a point between the inductor and the semiconductor light emitting element; wherein a capacitor having first and second terminals, the first terminal of the capacitor being connected between the power supply and the switching element and the second terminal of the capacitor being connected to a ground potential; wherein a switch drive circuit adapted to supply the switching element with a waveform signal having a predetermined duty ratio with which the switching element is driven.

2. A light source device comprising:
   a semiconductor light emitting element;
   the drive circuit of a semiconductor light emitting element according to claim 1; and
   a wavelength conversion element adapted to convert the laser beam, which is output from the semiconductor light emitting element, into a second harmonic wave.

3. An illumination device comprising: the light source device according to claim 2.

4. A monitor device comprising:
   the light source device according to claim 2; and
   an imaging section adapted to image an object lighted by the light source device.

5. An image display device comprising:
   the light source device according to claim 2; and
   a light modulation device adapted to modulate the light, which is emitted from the light source device, in accordance with image information.

* * * * *